United States Patent
Yoo et al.

(10) Patent No.: US 7,344,979 B2
(45) Date of Patent: Mar. 18, 2008

(54) HIGH PRESSURE TREATMENT FOR IMPROVED GRAIN GROWTH AND VOID REDUCTION

(75) Inventors: Woo Sik Yoo, Palo Alto, CA (US); Kitaek Kang, Dublin, CA (US)

(73) Assignee: WaferMasters, Inc., San Jose, CA (US)

( * ) Notice: Subject to any disclaimer, the term of this patent is extended or adjusted under 35 U.S.C. 154(b) by 339 days.

(21) Appl. No.: 11/056,419

(22) Filed: Feb. 11, 2005

(65) Prior Publication Data

US 2006/0183326 A1    Aug. 17, 2006

(51) Int. Cl.
*H01L 21/44* (2006.01)

(52) U.S. Cl. .............................. 438/660; 257/E21.582; 257/E21.588; 438/672

(58) Field of Classification Search ................ 438/660, 438/661, 672; 257/E21.582, E21.588
See application file for complete search history.

(56) References Cited

U.S. PATENT DOCUMENTS

| | | | |
|---|---|---|---|
| 6,323,120 B1 * | 11/2001 | Fujikawa et al. | 438/629 |
| 6,451,682 B1 * | 9/2002 | Fujikawa et al. | 438/618 |
| 2003/0129832 A1 * | 7/2003 | Fujikawa et al. | 438/660 |

* cited by examiner

*Primary Examiner*—Caridad Everhart
(74) *Attorney, Agent, or Firm*—MacPherson Chen & Heid LLP; Tom Chen

(57) ABSTRACT

A copper film is annealed at high pressure to enhance grain growth and remove voids. Other films, such as dielectrics, may also be suitable. High pressure can be used in conjunction with temperatures lower than room temperature for annealing or higher temperatures may be used to further enhance grain growth.

16 Claims, 2 Drawing Sheets

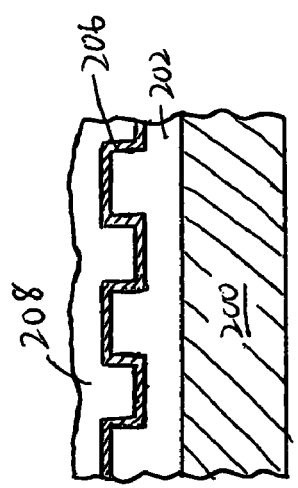
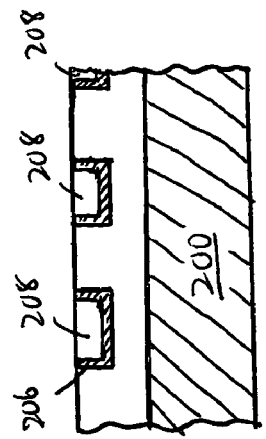
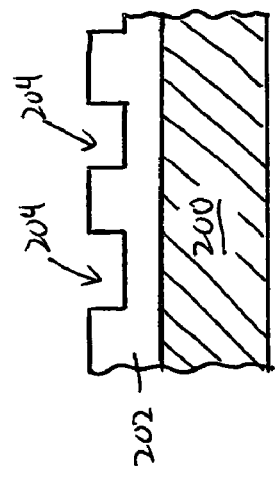
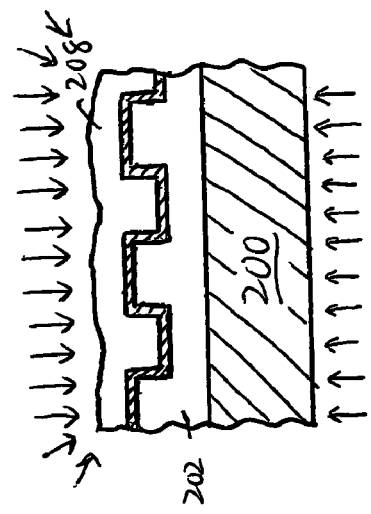
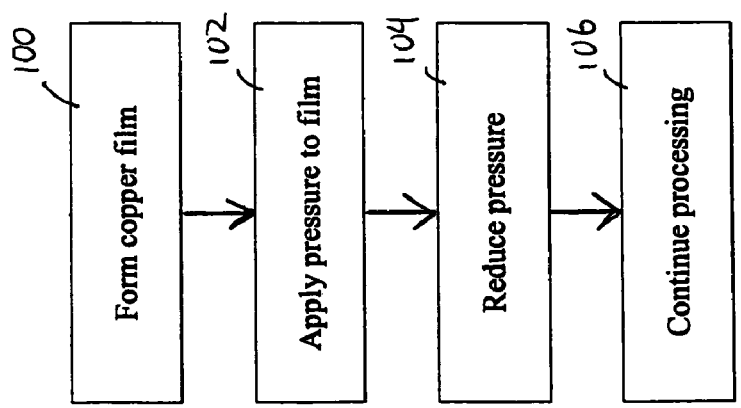

HIGH PRESSURE TREATMENT FOR IMPROVED GRAIN GROWTH AND VOID REDUCTION

BACKGROUND OF THE INVENTION

1. Field of the Invention

The present invention relates the manufacture of semiconductor devices, and more particular, to improving grain growth and reducing voids during such manufacturing.

2. Related Art

Integrated circuits fabricated on semiconductor substrates for very and ultra large scale integration typically require multiple levels of metal layers to electrically interconnect the discrete layers of semiconductor devices on the semiconductor chips. The different levels of metal layers are separated by various insulating or dielectric layers (also known as interlevel dielectric (ILD) layers), which have etched via holes to connect devices or active regions from one layer of metal to the next.

As semiconductor technology advances, circuit elements and dimensions on wafers or silicon substrates are becoming increasingly more dense. Consequently, the interconnections between various circuit elements and dielectric layers need to be as small as possible. One way to reduce the size of interconnection lines and vias is to use copper (Cu) as the interconnect material instead of conventionally used materials such as aluminum (Al). Because copper has lower resistivities and significantly higher electromigration resistance as compared to aluminum, copper advantageously enables higher current densities experienced at high levels of integration and increased device speed at higher frequencies. Thus, major integrated circuit manufacturers are transitioning from aluminum-based metallization technology to dual damascene copper technology. Copper interconnect lines can also be made thinner than aluminum lines, which reduces crosstalk between the lines.

However, as devices get smaller and smaller, the copper lines become increasingly thinner and narrower. Due to the characteristics of copper, as the copper lines become thinner and narrower, the resistivity of the copper increases and approaches that of aluminum. One way to reduce the resistivity is to self-anneal the copper, i.e., the copper undergoes a re-crystallization at room temperature. This results in a reduction in resistivity and a physical change in the copper structure. Sheet resistance, in the past, has been reduced by annealing at room temperature for a longer time.

However, copper self-anneal does not grow larger grains. Larger grain sizes are advantageous for reducing adverse effects from the change in the copper microstructure. The adverse effects include a higher resistance in the lines with very small dimension due to electron scattering from grain boundaries, defects, and surfaces. One method to grow larger grains, while still reducing sheet resistance, is to anneal the copper at temperatures higher than room temperature, e.g., greater than 100° C. This results in growing larger grains, along with clear grain boundaries. This method may be suitable for annealing blanket copper film, but with thin narrow copper wires (e.g., 500 or 1000 angstroms wide), annealing at higher temperatures can become problematic since the grain size approaches the size of the copper wire. Growing grains in small wires is also difficult due to the amount of material available for the grain growth. Grain growth also results in small micro-voids between the grains. Consequently, as grain boundaries are grown, the number of grains and the curvature of the grain boundaries decrease.

During anneal process steps, grain growth of the copper films also creates stresses that can damage or destroy the thin film. The stresses lead to warping and bowing and ultimately to film cracking which undermines desired low resistivity of the copper. Micro-voids are also formed during the copper deposition. Micro-voids can cause reliability problems and other associated adverse effects with the resulting copper film. Self-annealing does not remove the micro-voids.

Therefore, there is a need for forming copper films that overcome the disadvantages of conventional methods discussed above.

SUMMARY

According to one aspect of the present invention, a copper film anneal is performed at pressures higher than atmospheric to enhance grain growth and reduce micro-voids. Pressure greater than 1 atmosphere, for example, up to 500 atmospheres, applied to a porous material, such as copper, forces micro-voids to escape to the surface. The pressure can be applied to a semiconductor device inside a process chamber, the device having a copper film, other metal film, dielectric film, or other suitable semiconductor film formed thereon, such as a copper film formed by a dual damascene technique. High pressure liquid or gas can be introduced into the process chamber to raise the pressure to a suitable level.

In another embodiment, the temperature in the process chamber can be increased, along with the pressure. Increasing both the pressure and temperature enhances grain growth and aids in void removal. Since high pressure promotes grain growth and removes voids, a copper anneal or other similar process can operate at temperatures less than conventional temperatures. This enables process engineers to select a lower processing temperature while still producing a film that meets conventional standards. Thus, grain growth is possible at temperatures less than room temperature.

These and other features and advantages of the present invention will be more readily apparent from the detailed description of the embodiments set forth below taken in conjunction with the accompanying drawings.

BRIEF DESCRIPTION OF THE FIGS.

FIG. 1 is a flow chart showing a high pressure treatment of a copper film according to one aspect of the present invention;

FIGS. 2A-2D are cross-sectional views of a portion of a semiconductor wafer during various stages of a process flow according to one embodiment of the invention;

Like reference numerals are used to identify like elements illustrated in one or more of the figures.

DETAILED DESCRIPTION

Figure 3:
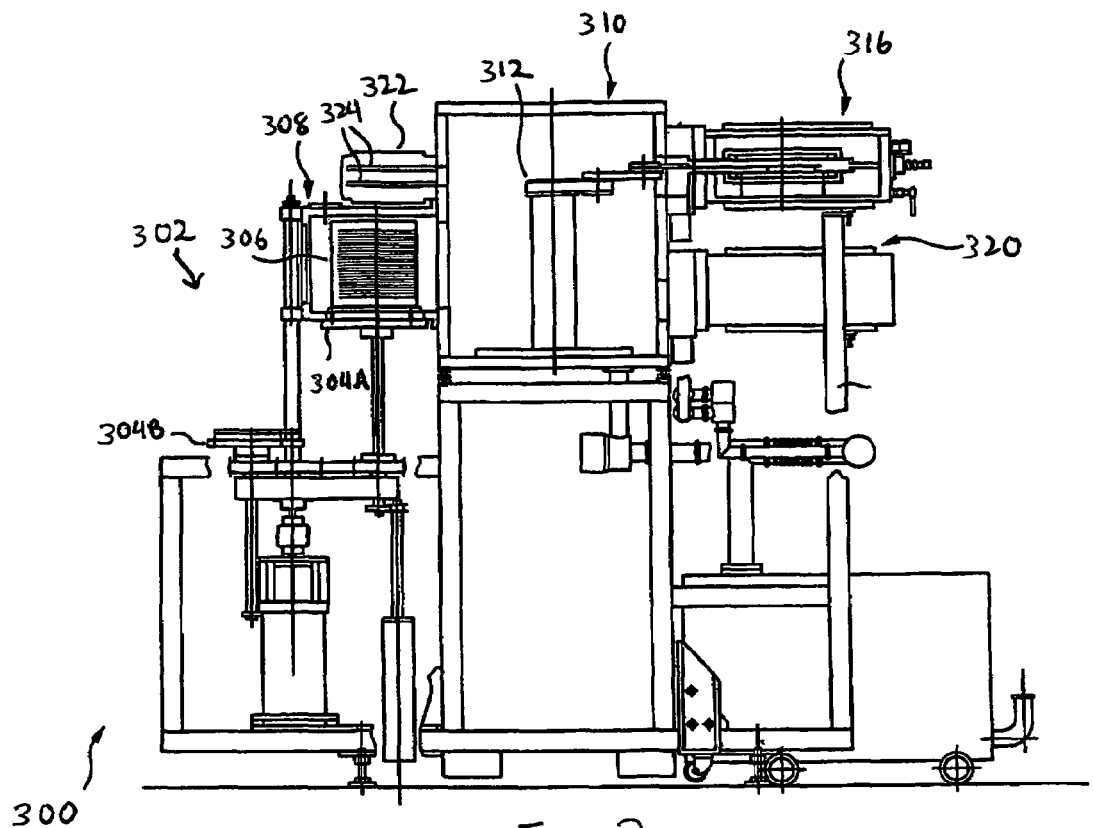
FIG. 3 is a schematic illustration of a side view of one embodiment of a semiconductor wafer processing system for use with the present invention.

FIG. 1 is a flow chart showing one embodiment of the present invention for forming a copper layer on a semiconductor device during semiconductor processing. In step 100, a copper layer or film is formed on a semiconductor device in a high pressure process chamber. The copper film can be formed by any suitable conventional method, such as a dual damascene technique. In the dual damascene approach, a dielectric or insulating diffusion barrier layer is deposited over a copper layer. The dielectric layer is then patterned, e.g., by conventional masking and etching techniques, to form a two-step connection having a narrower lower portion (or via portion) exposing desired connection areas on the underlying patterned metal layer and a wider upper portion (or trench portion) that will form the next layer of metal lines. Copper is then deposited to fill the via and trench, such as by electroplating. The chamber is pressurized, in step 102, such as up to 500 atm. Chamber pressurization can be with gas, fluid, or solid. Heat may optionally be supplied with the pressure. If desired, the temperature of the chamber can be increased up to approximately 1000° C. The pressure forces micro-voids between grain boundaries of the copper film to be formed to the surface and removed, resulting in a higher quality copper film. In step 104, the pressure can be adjusted, such as back to atmospheric pressure or another pressure suitable for additional processing. Subsequent processing then continues in step 106, such as removal of excess copper, e.g., by a chemical mechanical polish (CMP) process, to form a via and copper line.

FIGS. 2A-2D are cross-sectional views of a portion of a semiconductor wafer during various stages of a process flow according to one embodiment of the invention. In FIG. 2A, a silicon substrate 200 has an insulating layer 202 formed thereon. Silicon substrate 200 can be any type of silicon substrate including substrates containing oxygen. Substrate 200 may already have been subjected to a variety of processes associated with the formation of integrated circuits. Insulating layer 202 may be any suitable material, such as ones consisting of silicon oxide, polyimide, or any similar low dielectric constant material. Insulating layer 202 is then patterned and etched to form trenches 204 in its upper surface. Forming the trench can be by dry plasma etching, wet etching, or other suitable method. The depth of and the spacing between the trenches is dependent on various factors, such as the device application and requirements.

Next, as shown in FIG. 2B, a conformal diffusion barrier layer 206 is formed over insulating layer 202, including the side walls of layer 202. Materials for the barrier layer 206 include Tantalum (Ta), Tungsten Nitride (WN), Titanium Nitride (TiN), Tantalum Nitride (TaN), Silicon Nitride (SiN), and Tungsten (W). The barrier layer may be deposited using a conventional chemical vapor deposition (CVD) process, physical vapor deposition (PVD) process or other known deposition process. Typical thickness range from about 200 and 2,000 Angstroms. Barrier layer 206 prevents copper atoms from a subsequently formed copper layer from diffusing into adjacent or underlying insulating layers, which can compromise their integrity as insulators or cause voids in the conductors because of out-diffusion of the copper. A seed layer (not shown) is optionally deposited over barrier layer 206. Seed layers provide sufficient electrical conductance across the wafer, so that a subsequent uniform copper layer can be electroplated. In order to electroplate copper, the underlying surface has to be able to conduct current across its surface since electroplating is an electrochemical process. The diffusion barrier typically has high sheet resistance, so that the current required for plating causes an excessive voltage drop between the center and edge of the wafer. Thus, a seed layer, typically copper, can be deposited over the diffusion barrier. Deposition can be performed by any suitable process, such as PVD.

A copper layer 208 is then formed over device to a depth sufficient to ensure that all parts of trenches 204 are filled with copper as well as those parts of barrier layer 206 and the seed layer that lie outside trenches 204. In one embodiment, the thicknesses of the copper is between approximately 10 nm and approximately 100 µm. Copper deposition may be any suitable method, such as electroplating, chemical vapor deposition (CVD), or physical vapor deposition (PVD). An optional copper reflow step may be added following copper deposition.

Next, in FIG. 2C, pressure, represented by arrows, is applied to the device. The amount of pressure can be above 1 atmosphere and in some embodiments, up to 500 atmospheres. The amount of pressure can depend on various factors, such as the thickness copper layer. Because copper is a porous material, the pressure forces micro-voids (not shown) contained in copper layer 208 between grain boundaries to the surface of copper layer 208 and escape through the surface. As a result, grain growth is enhanced with a higher quality copper layer. In one embodiment, pressure is applied with a high pressure gas, such as a hydrogen-containing gas. Hydrogen-containing gases enable control of the processing environment and ambients, such as oxygen. In other embodiments, the high pressure gas is Ar, He, $N_2$, $H_2$, or forming gas. In other embodiments, pressure can be applied using fluids or solids, such as mineral oils or synthetic oils and metal or ceramics with hardness higher than Cu. Heat can also be supplied in conjunction with the pressure. So, the temperature in which the pressure is applied can be from 0° C. to 1000° C. The present invention also allows processing temperatures conventionally used for annealing to be reduced if desired.

In FIG. 2D, excess copper in the resulting copper layer 208, e.g., above the level of the top of trenches 204, is removed together with those parts of barrier layer 206 and the seed layer that lie outside the trenches. Copper removal can be performed using any suitable technical, such as chemical-mechanical polishing (CMP) or a blanket etch-back in a chlorine plasma at high temperature. Device processing can then continue, such as processing after conventional self-anneals.

FIG. 3 is a schematic illustration of a side view of one embodiment of a semiconductor wafer processing system 300 that establishes a representative environment of the present invention. Processing system 300 includes a loading station 302 which has multiple platforms 304A and 304B for supporting and moving a wafer carrier or cassette 306 up and into a loadlock 308. Wafer cassette 306 may be a removable cassette which is loaded into platform 304A or 304B, either manually or with automated guided vehicles (AGV). Wafer cassette 306 may also be a fixed cassette, in which case wafers are loaded onto cassette 306 using conventional atmospheric robots or loaders (not shown), or a front opening unified pod (FOUP). Once wafer cassette 306 is inside loadlock 308, loadlock 308 and a transfer chamber 310 are maintained at atmospheric pressure or else are pumped down to vacuum pressure. A robot 312 within transfer chamber 310 rotates toward loadlock 308 and picks up a wafer from cassette 306. A processing chamber 316 for forming a layer on a substrate or wafer, which may be at a pressure between 1 atmosphere and 500 atmospheres, accepts the wafer from robot 312 through a gate valve. Optionally, additional reactors or processing chambers may be added to the system, for example a processing chamber 320 for annealing. Robot 312 then retracts and, subsequently, the gate valve closes to begin the processing of the wafer, such as processing a copper film, as described below. After the wafer is processed, the gate valve opens to allow robot 312 to remove and place the wafer. Optionally, a cooling station 322 is provided with platforms 324, which allows the newly processed wafers to cool before they are placed back into a wafer cassette in loadlock 308. Commonly-owned U.S. Pat. No. 6,410,455 discloses a representative wafer processing system and is incorporated by reference in its entirety.

Figure 4:
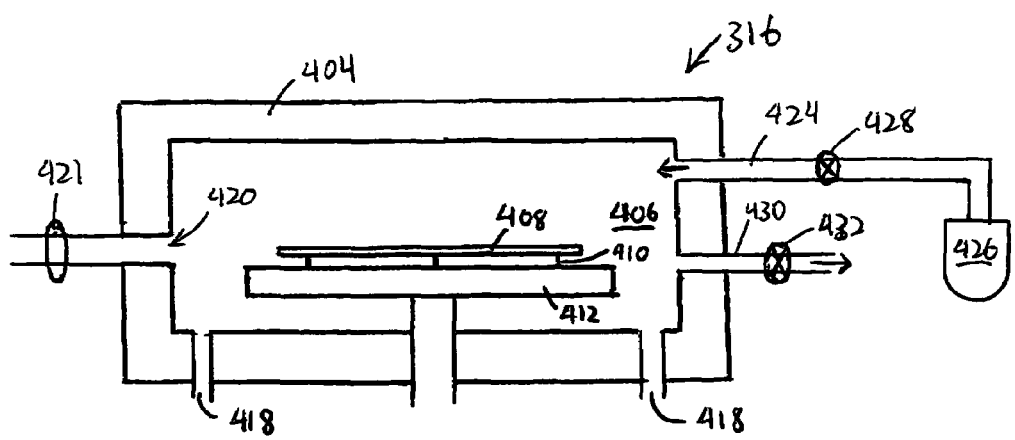
FIG. 4 is simplified cross-sectional view of a processing chamber from the processing system of FIG. 3 for processing a copper film or layer in accordance with an embodiment of the present invention.

FIG. 4 is a simplified cross-sectional view of processing chamber 316 for processing a copper film or layer in accordance with an embodiment of the present invention. Externally, thermal processing chamber 316 may be a metallic shell 402 preferably made of aluminum or similar metal, defining an opening configured to receive a wafer for processing.

Thermal processing chamber 316 includes a process tube 404, which defines an interior cavity 406 in which processing of a wafer 408 can occur. In one embodiment, process tube 404 may be constructed with a substantially rectangular cross-section, having a minimal internal volume surrounding wafer 408. Process tube 404 can be made of quartz, but may be made of silicon carbide, $Al_2O_3$, or other suitable material. Process tube 404 can be capable of being pressurized with pressures between about 1 atmosphere and 500 atmospheres.

Positioned within cavity 406 of process tube 404 are wafer support standoffs 410, which support the single wafer 408. Standoffs 410 may be any high temperature resistant material, such as quartz. In some embodiments, standoffs 410 may have a height of between about 50 μm and about 20 mm. Standoffs 410 support and separate wafer 408 from a susceptor or heater 412, which is used to heat wafer 408 to a desired processing temperature. Chamber heating elements (not shown) may be located adjacent the process tube to heat the chamber to a desired temperature, for example, from room temperature up to 1000° C. or more. Heat diffusing members can be positioned between the heating elements and process tube 404. The heat diffusing members absorb the thermal energy output from the heating elements and dissipate the heat evenly across process tube 404. The heat diffusing members may be any suitable heat diffusing material that has a sufficiently high thermal conductivity, preferably silicon carbide, $Al_2O_3$, or graphite.

Any suitable gas or vapor distribution system (not shown) can be used to introduce process gases into cavity 406. Chamber 316 also has one or more exhaust ports 418, located at the bottom of tube 404, for expelling gases or other process residue. An opening 420 provides access for the loading and unloading of wafer 408 before and after processing. Opening 420 may be a relatively small opening. In one embodiment, opening 420 may have a height and width large enough to accommodate a wafer of between about 0.5 to 2 mm thick and up to about 300 mm (~12 in.) in diameter, and a portion of robot 306 (FIG. 3) passing therethrough. The height of opening 420 can be between about 18 mm and 50 mm, for example, no greater than about 20 mm. It should be understood that the size of process tube 404 and opening 420 can be made any size large enough to accommodate the processing of any sized wafer. A gate valve 421 or other suitable valve can be opened to bring cavity 406 to an atmospheric pressure or shut to pressure-seal cavity 406 for raising and maintaining a high pressure within the chamber.

In one embodiment, a high pressure inlet 424 allows flow of gas or liquid into cavity 406, such as forming gas, $N_2$, $H_2$, Ar, or He. A high pressure source 426, such as a high pressure tank, is coupled to one end of inlet 424. A valve 428, such as an air operated valve (AOV), is located between chamber 316 and source 426. Opening valve 428, either completely or partially, enables high pressure liquid or gas from source 426 to flow into cavity 406, thereby pressurizing cavity 406 to a desired high pressure. When a desired pressure inside cavity 406 is achieved, valve 428 is closed to maintain the pressure. An opening 430 with a pressure release valve 432, such as a second AOV allows gas or liquid to escape from cavity 406 to reduce the pressure within cavity 406. Thus, when release valve 432 is opened, pressure in cavity 406 can be reduced or brought back down to atmospheric pressure.

In one embodiment, wafer 408 having a layer or film of copper is placed into process chamber 316 through opening 420. For example, processing before placement into the chamber can comprise conventional steps, such as described above. Processing, including forming the copper film on the wafer, can also occur within the chamber. The chamber or cavity 406 is then pressurized, such as to a pressure of greater than 1 atm and less than approximately 500 atm, which enhances grain growth and removes voids within the copper film, among other physical property modifications. During this higher pressure anneal, the temperature within cavity 406 can also be increased, such as through the heating elements and/or susceptor. Chamber 316 can be brought to a temperature of approximately 0° C. to 1000° C. The higher pressure, which when combined with heat, also enhances grain growth and void removal. After high pressure treatment, the pressure in chamber 316 can be brought back down to atmospheric or some other desired pressure for further processing, such as a CMP.

Having thus described embodiments of the present invention, persons skilled in the art will recognize that changes may be made in form and detail without departing from the spirit and scope of the invention. For example, the above description focused on processing of copper films. The present invention is not limited to copper, as other films or layers, such as other metal films, dielectric films, or semiconductor films may also be suitable. Thus the invention is limited only by the following claims.

What is claimed is:

1. A method for processing a semiconductor wafer, comprising:
   providing a copper film over the semiconductor wafer;
   applying a pressure higher than one atmosphere to the copper film to enhance grain growth and reduce voids in the copper film; and
   applying a temperature at room temperature or less.

2. The method of claim 1, further comprising applying a temperature higher than 0° C.

3. The method of claim 1, wherein the pressure is less than approximately 500 atmospheres.

4. The method of claim 1, wherein the providing comprises forming the copper film by a dual damascene technique.

5. The method of claim 1, wherein the copper film is less than approximately 100 μm thick.

6. The method of claim 1, further comprising placing the semiconductor wafer within a processing chamber.

7. The method of claim 6, wherein the applying comprises introducing a high pressure element into the chamber.

8. The method of claim 7, wherein the element comprises gas, liquid, or solid.

9. A method for processing a semiconductor wafer, comprising:
   providing a copper film over the semiconductor wafer;
   applying a pressure higher than one atmosphere to the copper film to enhance grain growth and reduce voids in the copper film; and
   applying a temperature less than room temperature.

10. A method for treating a film formed on a semiconductor wafer during device processing in a processing chamber, the method comprising:
   providing porous layer of material over the semiconductor wafer;
   pressurizing the chamber to a pressure greater than one atmosphere to enhance grain growth and reduce voids in the film; and
   applying a temperature at room temperature or less.

11. The method of claim 10, wherein the material comprises a metal or dielectric.

12. The method of claim 11, wherein the material is copper.

13. A method for treating a film formed on a semiconductor wafer during device processing in a processing chamber, the method comprising:
   providing porous layer of material over the semiconductor wafer;
   pressurizing the chamber to a pressure greater than one atmosphere to enhance grain growth and reduce voids in the film; and
   reducing the temperature of the chamber to less than room temperature.

14. The method of claim 10, wherein the layer is approximately 100 μm thick or less.

15. The method of claim 10, wherein the pressurizing comprises introducing a high pressure element into the chamber.

16. The method of claim 15, wherein the element comprises a gas or liquid.

* * * * *